US006451381B2

(12) United States Patent
Nakamura et al.

(10) Patent No.: US 6,451,381 B2
(45) Date of Patent: Sep. 17, 2002

(54) ELECTRICALLY INSULATING CROSSLINKED THIN-FILM-FORMING ORGANIC RESIN COMPOSITION AND METHOD FOR FORMING THIN FILM THEREFROM

(75) Inventors: Takashi Nakamura; Akihiko Kobayashi; Kiyotaka Sawa; Katsutoshi Mine, all of Chiba (JP)

(73) Assignee: Dow Corning Toray Silcone Co., Ltd., Tokyo (JP)

(*) Notice: Subject to any disclaimer, the term of this patent is extended or adjusted under 35 U.S.C. 154(b) by 0 days.

(21) Appl. No.: 09/765,196

(22) Filed: Jan. 18, 2001

(30) Foreign Application Priority Data

Mar. 3, 2000 (JP) ........................................ 2000-058484

(51) Int. Cl.⁷ ..................... C08G 77/455; B05D 3/02
(52) U.S. Cl. ........................... 427/387; 528/27; 528/25; 528/26; 528/31; 528/32; 528/38; 528/15; 528/332; 528/338; 522/99
(58) Field of Search .................. 427/387; 525/431; 528/25, 15, 26, 31, 32, 38, 332, 338, 27; 522/99

(56) References Cited

U.S. PATENT DOCUMENTS

| 4,634,610 A | * | 1/1987 | Keohan et al. | ............ 427/387 |
| 5,773,561 A | * | 6/1998 | Sachdev et al. | ............ 528/353 |
| 6,265,497 B1 | * | 7/2001 | Herzig | ........................ 525/478 |

FOREIGN PATENT DOCUMENTS

| JP | 6-80783 | 3/1994 | ........... C08G/77/54 |
| JP | 8-183856 | 7/1996 | ........... C08G/73/10 |
| JP | 10-279687 | 10/1998 | ........... C08G/77/12 |
| JP | 11-135493 | 5/1999 | ......... H01L/21/312 |

* cited by examiner

Primary Examiner—Robert Dawson
Assistant Examiner—Marc S Zimmer
(74) Attorney, Agent, or Firm—Rick D. Streu; Catherine U. Brown

(57) ABSTRACT

An electrically insulating crosslinked thin-film-forming organic resin composition comprising (A) an electrically insulating organic resin having silicon atom-bonded hydrogen atoms or silicon atom-bonded alkenyl groups and (B) a solvent, and a method for forming a crosslinked thin film therefrom.

4 Claims, No Drawings

ELECTRICALLY INSULATING CROSSLINKED THIN-FILM-FORMING ORGANIC RESIN COMPOSITION AND METHOD FOR FORMING THIN FILM THEREFROM

FIELD OF THE INVENTION

The present invention relates to an electrically insulating crosslinkable thin-film-forming organic resin composition and to a method for forming an electrically insulating crosslinkable thin film. More particularly, it relates to an electrically insulating crosslinked thin-film-forming organic resin composition from which it is possible to form a crosslinkable thin film having good heat resistance and low dielectric constant and excellent adhesion to the surface of electronic devices, and to a method for efficiently forming on the surface of an electronic device a thin film having good heat resistance and low dielectric constant and excellent adhesion to the surface.

BACKGROUND OF THE INVENTION

Examples of a method for forming an electrically insulating crosslinked thin film on the surface of an electronic device include a method in which the surface of an electronic device is coated with a hydrogen silsesquioxane resin solution, the solvent is evaporated off, and the surface is then heated at 150 to 1000° C. (see Japanese Laid-Open Patent Application S63-144525), and a method in which the surface of an electronic device is coated with a solution of a hydrogen silsesquioxane resin and a platinum or rhodium catalyst, the solvent is evaporated off, and the surface is then heated at 150 to 1000° C. (see Japanese Laid-Open Patent Application S63-144524).

As miniaturization and integration have increased in electronic devices in recent years, there has been a need for a method for forming an electrically insulating layer with a low dielectric constant. More specifically, there is a need for a method for forming an electrically insulating layer with a low dielectric constant (a specific inductive capacity of less than 2.5) in a highly integrated circuit with a next-generation design rule of 0.15 μm or less. Accordingly, Japanese Laid-Open Patent Application H10-279687 proposes a method in which the surface of an electronic device is coated with a solution composed of a hydrogen silsesquioxane resin and two types of solvent with different boiling points or affinity to this resin, after which part of the solvent is evaporated, and the surface is heated to evaporate the solvent either during or after the crosslinking of the resin, thereby forming a porous electrically insulating crosslinked thin film.

However, a porous electrically insulating crosslinked thin film generally has poor mechanical strength and is susceptible to infiltration and attack by a variety of chemicals, and therefore cannot sufficiently stand up to next-generation multilayer wiring processes, and particularly a copper dual damascene process, therefore making such films impractical. Also, to form an electrically insulating crosslinked thin film with a low dielectric constant, a relatively large amount of silicon atom-bonded hydrogen atoms must be present in the hydrogen silsesquioxane resin, and consequently the silicon atom-bonded hydrogen atoms in the thin film react due to the heat, various chemicals, or plasma encountered in the various steps following the formation of the thin film, such as the multilayer wiring of an electronic device, which further raises the density of the thin film and drives up the dielectric constant.

There have also been numerous proposals for electrically insulating crosslinkable thin-film-forming organic resin compositions that form electrically insulating thin films with a relatively low dielectric constant, but the problem with these electrically insulating thin films is their poor heat resistance and when they are heated to over 400° C. in the course of manufacturing an electronic device there is a decrease in the film quality or quantity. Furthermore, such electrically insulating thin films have inferior adhesion to electronic device surfaces and peel off during the manufacturing of such an electronic device.

Specifically, it is an object of the present invention to provide an electrically insulating crosslinkable thin-film-forming organic resin composition from which it is possible to form a crosslinked thin film having good heat resistance and low dielectric constant and excellent adhesion to the surface of electronic devices, and to a method for efficiently forming on an electronic device surface an electrically insulating crosslinked thin film having good heat resistance and low dielectric constant and excellent adhesion to the surface of electronic devices.

SUMMARY OF THE INVENTION

The present invention is an electrically insulating crosslinkable thin-film-forming organic resin composition comprising (A) an electrically insulating organic resin having silicon atom-bonded hydrogen atoms or silicon atom-bonded alkenyl groups and (B) a solvent, and a method for forming a crosslinked thin film therefrom.

DESCRIPTION OF THE INVENTION

The present invention is an electrically insulating crosslinkable thin-film-forming organic resin composition comprising (A) an electrically insulating organic resin having silicon atom-bonded hydrogen atoms or silicon atom-bonded alkenyl groups and (B) a solvent, and a method for forming a crosslinked thin film therefrom.

First, the electrically insulating crosslinkable thin-film-forming organic resin composition of the present invention will be described in detail. Examples of the electrically insulating organic resin of component (A) include polyimide resins; polytetrafluoroethylene resins and other fluorocarbon resins; benzocyclobutene resins; fluorinated polyallyl ether resins; polyethylene resins and other polyolefin resins; and polyacrylate resins, polycarbonate resins, polyamide resins, polysulfone resins, polyether ether ketone resins, polyether nitrile resins, polystyrene resins, and ABS resins. Preferably, this resin is a silicone modified organic resin composed of organic resin blocks and organopolysiloxane blocks. Most preferred is a silicone modified polyimide resin composed of polyimide resin blocks and organopolysiloxane blocks. Preferably, the silicon atom-bonded hydrogen atoms or alkenyl groups are bonded to silicon atoms in the organopolysiloxane blocks in the electrically insulating organic resin of component (A). It is particularly favorable if they are bonded to the silicon atoms in the organopolysiloxane blocks in a silicone modified polyimide resin. A silicone modified polyimide resin having silicon atom-bonded hydrogen atoms such as this is described by the following general formula.

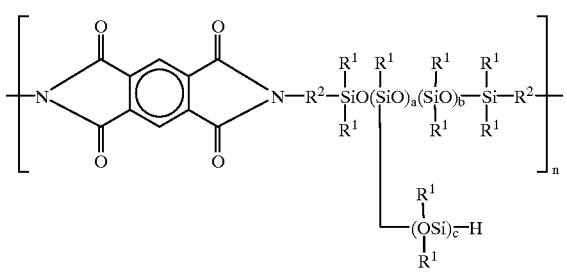

In the above formula, $R^1$ is an alkyl group or aryl group. Examples of the alkyl groups represented by $R^1$ include methyl, ethyl, and propyl, while examples of the aryl groups represented by $R^1$ include phenyl and tolyl. $R^2$ in the above formula is an alkylene group or arylene group. Examples of the alkylene groups represented by $R^2$ include methylene, ethylene, and propylene, while examples of the arylene groups represented by $R^2$ include phenylene. Subscript a in the above formula is an integer of at least one, b is an integer of zero or greater, c is an integer of at least one, and n is an integer of at least one. An example of a silicone modified polyimide resin such as this is described by the following general formula.

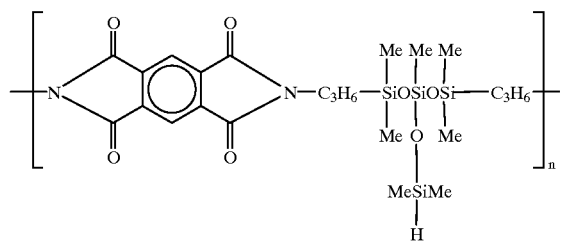

In the formula, Me is a methyl group and n is an integer of at least one.

An example of a silicone modified polyimide resin having silicon atom-bonded alkenyl groups is expressed by the following general formula.

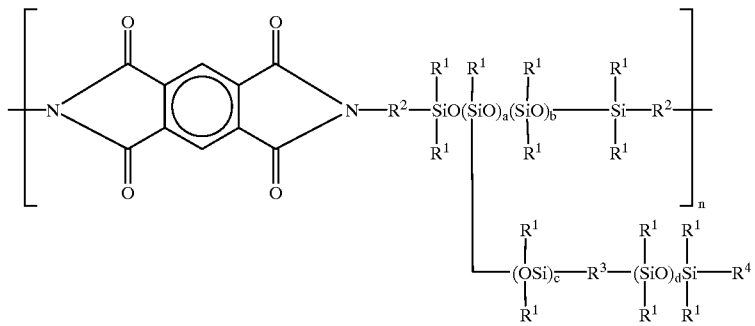

$R^1$ in the above formula is an alkyl group or aryl group. Examples of the alkyl groups represented by $R^1$ include methyl, ethyl, and propyl, while examples of the aryl groups represented by $R^1$ include phenyl and tolyl. $R^2$ in the above formula is an alkylene group or arylene group. Examples of the alkylene groups represented by $R^2$ include ethylene and propylene, while examples of the arylene groups represented by $R^2$ include phenylene. $R^3$ in the above formula is an alkylene group, examples of which include ethylene and propylene. $R^4$ in the above formula is an alkenyl group, example of which includes vinyl, allyl, and butenyl. Subscript a in the above formula is an integer of at least one, b is an integer of zero or greater, c is an integer of at least one, d is an integer of at least one, and n is an integer of at least one. An example of a silicone modified polyimide resin such as this is described by the following formula.

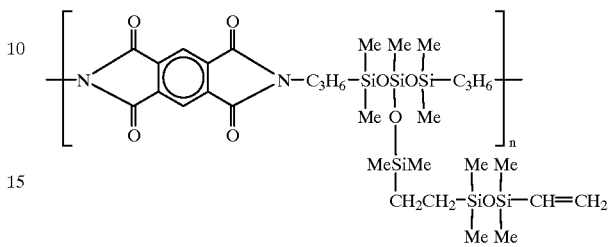

In the formula, Me is a methyl group and n is an integer of at least one.

When two or more types of electrically insulating organic resin are used together as component A in the present composition, a combination of (i) an electrically insulating organic resin having silicon atom-bonded hydrogen atoms and (ii) an electrically insulating organic resin having silicon atom-bonded alkenyl groups is preferable. Examples of the electrically insulating organic resin of component (i) are the same as those listed above, with a silicone modified organic resin composed of organic resin blocks and organopolysiloxane blocks being preferable, and a silicone modified polyimide resin composed of polyimide resin blocks and organopolysiloxane blocks being particularly favorable. Examples of such silicone modified polyimide resins are the same as those listed above. Examples of the electrically insulating organic resin of component (ii) are the same as those listed above, with a silicone modified organic resin composed of organic resin blocks and organopolysiloxane blocks being preferable, and a silicone modified polyimide resin composed of polyimide resin blocks and organopolysiloxane blocks being particularly favorable. Examples of such silicone modified polyimide resins are the same as those listed above. When component (i) and component (ii) are used together, it is preferable for the amount of component (ii) to be such that the amount of alkenyl groups in component (ii) is 0.1 to 10 mol per mole of silicon atom-bonded hydrogen atoms in component (i). This is because if the component (ii) content is outside the above range, there is the danger that the obtained composition will not be sufficiently crosslinked merely by being left at room temperature or heated.

There are no particular restrictions on the solvent of component (B) as long as it will dissolve the above-mentioned component (A) without modifying component (A). Examples of useful solvents include toluene, xylene, and other aromatic solvents; hexane, heptane, octane, and other aliphatic solvents; methyl ethyl ketone, methyl isobutyl ketone, and other ketone-based solvents; butyl acetate, isoamyl acetate, and other aliphatic ester-based solvents; N,N'-dimethylformamide, N,N'-dimethylacetamide, N-methyl-2-pyrollidinone, dimethyl sulfoxide, diethylene glycol dimethyl ether, dibutyl ether, butyrolactone; hexamethyldisiloxane, 1,1,3,3-tetramethyldisiloxane, and other linear methylsiloxanes, 1,1,3,3,5,5,7,7-octamethyltetracyclosiloxane, 1,3,5,7-tetramethyltetracyclosiloxane, and other cyclic siloxanes; and silicon-based solvents of silane compounds such as tetramethylsilane and dimethyldiethylsilane. There are no restrictions on the amount in which component (B) is contained in the present composition, but it is general preferable for this amount to be at least 50 weight parts per 100 weight parts of component (A). This is because if the content of component (B) is below the above range, it will tend to be difficult for the resulting electrically insulating organic resin to be applied in a thin coating over the surface of a substrate such as an electronic device.

A hydrosilylation catalyst (C) may also be contained as an optional component in the present composition. In particular when (i) an electrically insulating organic resin having silicon atom-bonded hydrogen atoms and (ii) an electrically insulating organic resin having silicon atom-bonded alkenyl groups are used together as the electrically insulating organic resin of component (A), this catalyst will promote the hydrosilylation reaction of the silicon atom-bonded hydrogen atoms in component (i) with the alkenyl groups in component (ii). Examples of this hydrosilylation catalyst of component (C) include platinum catalysts, rhodium catalysts, and palladium catalysts, with a platinum catalyst being particularly favorable. Examples of platinum catalysts include chloroplatinic acid, an alcohol solution of chloroplatinic acid, an olefin complex of platinum, an alkenylsiloxane complex of platinum, and a carbonyl complex of platinum. There are no restrictions on the amount in which component (C) is contained in the present composition, as long as the amount is sufficient to promote the above-mentioned reaction, but an amount such that the catalyst metal in component (C) is between 1 and 1000 weight parts per million weight parts of component (A) is preferred. A sensitizer may also be added if the present composition is to be crosslinked solely by irradiation with high-energy rays.

The method of the present invention for forming an electrically insulating crosslinked thin film will now be described in detail. The method of the present invention for forming an electrically insulating crosslinked thin film is characterized in that the surface of an electronic device is coated with the above-mentioned electrically insulating crosslinkable thin-film-forming organic resin composition, and all or part of the solvent is evaporated, after which the electrically insulating organic resin contained in the composition is crosslinked by heating and/or irradiation with high-energy rays. In the present method the first step is to coat the surface of an electronic device with the above-mentioned electrically insulating crosslinkable thin-film-forming organic resin composition. Examples of coating methods include spin coating, dip coating, spray coating, and flow coating. After coating, all or part of the solvent is evaporated, and the surface is then subjected to heating and/or irradiation with high-energy rays. When the resulting electrically insulating thin film needs to be smooth, it is preferable to heat it at a temperature higher than the melting point of component (A). Examples of heating methods include the use of a heating furnace or a hot plate. When irradiation with high-energy rays is employed, examples of high-energy rays that can be used include ultraviolet rays, infrared rays, X-rays, and an electron beam, and the use of an electron beam is particularly favorable because component (A) can be thoroughly crosslinked.

EXAMPLES

The electrically insulating crosslinkable thin-film-forming organic resin composition and the method for forming an electrically insulating crosslinked thin film of the present invention will now be described in detail through examples. Me in the formulas represents a methyl group and n is a positive integer indicating the repeating units. The specific inductive capacity of the electrically insulating crosslinked thin film was measured at a temperature of 25° C. and 1 MHz using a sample formed on a silicon wafer with a resistivity of $10^{-2}$ Ω•cm. The measurement was performed using an impedance analyzer.

Reference Example 1.

6.4 g Of pyromellitic dianhydride and 31.5 g of a mixture of N,N'-dimethylacetamide and xylene (95:5 weight ratio) were put into a four-neck flask equipped with an agitator, a dropping funnel, and a thermometer, and were agitated under a nitrogen gas flow. 9.4 g Of a diamino functional siloxane compound described by formula

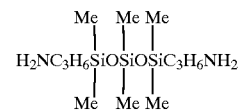

and 31.5 g of a mixture of N,N'-dimethylacetamide and xylene (95:5 weight ratio) were added dropwise through the dropping funnel over a period of about 15 minutes, with the reaction temperature varying between 26 and 33° C.

The resulting mixture was then agitated for 3 hours at a temperature between 25 and 33° C. A Dean-Stark tube was then attached and azeotropic dehydration was performned for 13 minutes at 140 to 144° C. After this, the mixture was cooled to room temperature and filtered, yielding 64.6 g of a solution of the silicone modified polyimide resin described by the following formula

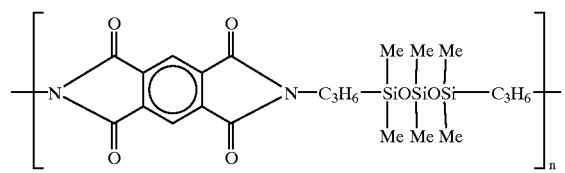

Reference Example 2.

3.6 g Of pyromellitic dianhydride and 34.8 g of a mixture of N,N'-dimethylacetamide and xylene (95:5 weight ratio) were put into a four-neck flask equipped with an agitator, a dropping funnel, and a thermometer, and were agitated under a nitrogen gas flow. 11.1 g Of a diamino functional siloxane compound described by formula

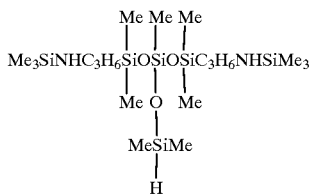

and 34.8 g of a mixture of N,N'-dimethylacetamide and xylene (95:5 weight ratio) were added dropwise through the dropping funnel over a period of about 30 minutes, with the reaction temperature varying between 29 and 37° C.

The resulting mixture was then agitated for 3.5 hours at a temperature between 26 and 37° C. A Dean-Stark tube was then attached and azeotropic dehydration was performed for 8 minutes at 144 to 146° C. After this, the mixture was cooled to room temperature and filtered, yielding 77.3 g of a solution of a silicone modified polyimide resin described by formula

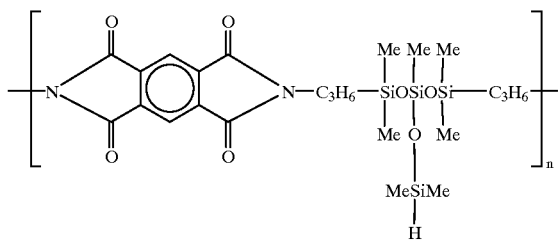

Reference Example 3.

3.6 g Of pyromellitic dianhydride and 35.0 g of a mixture of N,N'-dimethylacetamide and xylene (95:5 weight ratio) were put into a four-neck flask equipped with an agitator, a dropping funnel, and a thermometer, and were agitated under a nitrogen gas flow. 16.5 g Of a diamino functional siloxane compound described by formula

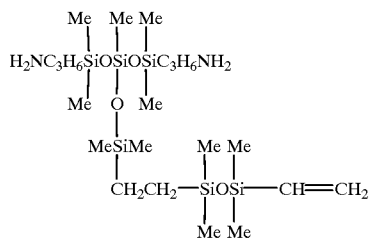

and 34.8 g of a mixture of N,N'-dimethylacetamide and xylene (95:5 weight ratio) were added dropwise through the dropping funnel over a period of about 30 minutes, with the reaction temperature varying between 29 and 37° C.

The resulting mixture was then agitated for 3.5 hours at a temperature between 26 and 37° C. A Dean-Stark tube was then attached and azeotropic dehydration was performed for 8 minutes at 144 to 146° C. After this, the mixture was cooled to room temperature and filtered, yielding 81 g of a solution of the silicone modified polyimide resin described by formula

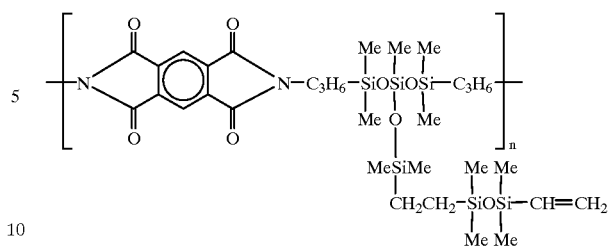

Example 1.

An electrically insulating crosslinkable thin-film-forming resin composition was prepared from 50 g of a solution of the silicone modified polyimide resin prepared in Reference Example 2, 50 g of the silicone modified polyimide resin prepared in Reference Example 3, and a 1,3-divinyltetramethylsiloxane complex of chloroplatinic acid (in an amount such that there was 5 ppm (by weight) platinum metal with respect to the overall reaction mixture). This composition was applied on a silicon wafer by spin coating at a speed of 3000 rpm, the solvent was evaporated off, and the wafer was heated for 1 minute on a 150° C. hot plate. The coated wafer was then heated for 3 hours in a quartz furnace (360° C.) under a nitrogen gas flow, forming an electrically insulating crosslinked thin film with a thickness of 520 nm and a specific inductive capacity of 2.4. The resulting electrically insulating crosslinked thin film was subjected to an annealing test for 1 hour in a quartz furnace (420° C.) under a nitrogen gas flow. Table 1 shows the film thickness before and after the annealing.

Example 2.

A solution of the silicone modified polyimide resin prepared in Reference Example 2 was applied on a silicon wafer by spin coating at a speed of 3000 rpm and the solvent was evaporated off, after which the coating was irradiated with an electron beam (300 Mrad) accelerated with 165 kV and then heated for 3 hours in a quartz furnace (360° C.) under a nitrogen gas flow, forming an electrically insulating crosslinked thin film with a thickness of 510 nm and a specific inductive capacity of 2.4. This thin film adhered well to the silicon wafer. The resulting electrically insulating crosslinked thin film was subjected to an annealing test for 1 hour in a quartz furnace (420° C.) under a nitrogen gas flow. Table 1 shows the film thickness before and after the annealing.

Example 3.

A solution of the silicone modified polyimide resin prepared in Reference Example 3 was applied to a silicon wafer by spin coating at a speed of 3000 rpm and the solvent was evaporated off, after which the coating was irradiated with an electron beam (300 Mrad) accelerated with 165 kV and then heated for 3 hours in a quartz furnace (360° C.) under a nitrogen gas flow, forming an electrically insulating crosslinked thin film with a thickness of 510 nm and a specific inductive capacity of 2.4. This thin film adhered well to the silicon wafer. The resulting electrically insulating crosslinked thin film was subjected to an annealing test for 1 hour in a quartz furnace (420° C.) under a nitrogen gas flow. Table 1 shows the film thickness before and after the annealing.

Comparative Example 1.

A solution of the silicone modified polyimide resin prepared in Reference Example 1 was applied to a silicon wafer by spin coating at a speed of 3000 rpm and the solvent was evaporated off, after which wafer was heated for 3 hours in a quartz furnace (360° C.) under a nitrogen gas flow, forming an electrically insulating crosslinked thin film with a thickness of 500 nm and a specific inductive capacity of 2.4. The resulting electrically insulating crosslinked thin film was subjected to an annealing test for 1 hour in a quartz furnace (420° C.) under a nitrogen gas flow. Table 1 shows the film thickness before and after the annealing. A reduction in the film thickness after annealing was observed.

TABLE 1

|  | Example 1 | Example 2 | Example 3 | Comparative Ex. 1 |
|---|---|---|---|---|
| Film thickness before annealing (nm) | 520 | 510 | 510 | 500 |
| Film thickness after annealing (nm) | 520 | 510 | 510 | 330 |

We claim:

1. A composition comprising:

(A) a silicone modified polyimide resin described by general formula

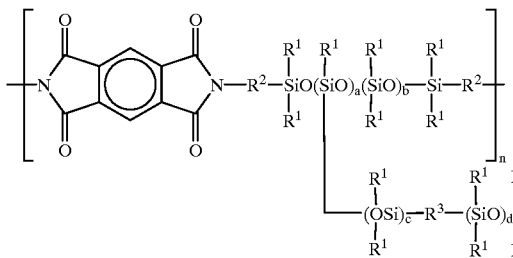

where $R^1$ is an alkyl group or aryl group, $R^2$ is an alkylene group or arylene group, $R^3$ is an alkylene group, $R^4$ is an alkenyl group, a is an integer of at least one, b is an integer of zero or greater, c is an integer of at least one, d is an integer of at least one, and n is an integer of at least one;

(B) a solvent.

2. A composition comprising
  (A) an electrically insulating organic resin comprising:
    (i) an electrically insulating organic resin having silicon atom-bonded hydrogren atoms and
    (ii) an electrically insulating organic resin having silicon atom-bonded alkenyl groups,
  (B) a solvent, and
  (C) a hydrosilylation catalyst; where
    component (i) is a silicone modified polyimide resin comprising polyimide resin blocks and organopolysiloxane blocks, and
    component (ii) is a silicone modified polyimide resin described by general formula

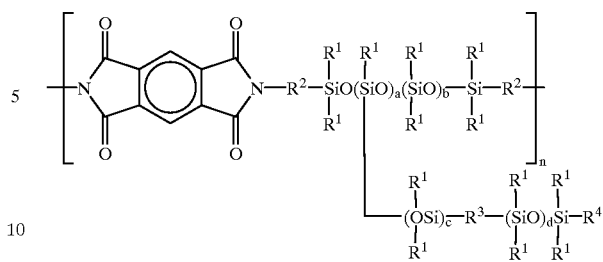

where $R^1$ is an alkyl group or aryl group, $R^2$ is an alkylene group or arylene group, $R^3$ is an alkylene group, $R^4$ is an alkenyl group, a is an integer of at least one, b is an integer of zero or greater, c is an integer of at least one, d is an integer of at least one, and n is an integer of at least one.

3. An composition comprising:

(A) an electrically insulating organic resin comprising
  (i) an electrically insulating organic resin having silicon atom-bonded hydrogen atoms, and
  (ii) an electrically insulating organic resin having silicon atom-bonded alkenyl groups;

(B) a solvent; and (C) a hydrosilylation catalyst wherein component (i) is described by general formula

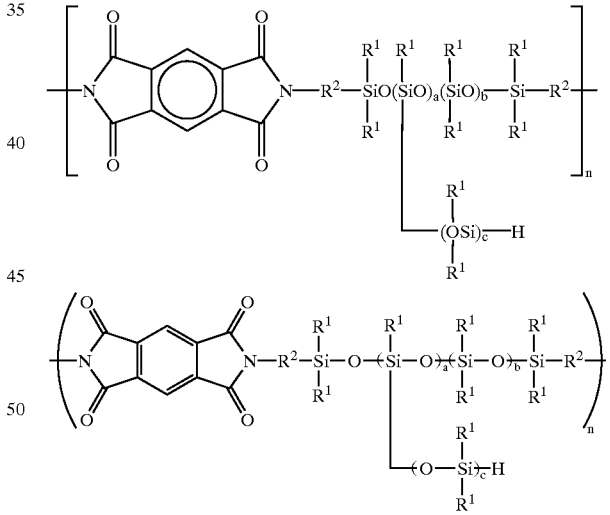

where $R^1$ is an alkyl group or aryl group, $R^2$ is an alkylene group or arylene group, a is an integer of at least one, b is an integer of zero or greater, c is an integer of at least one, and n is an integer of at least one.

4. A method comprising
  i) coating a surface of an electronic device with an electrically insulating crosslinkable thin-film-forming organic resin composition comprising
    (A) a silicone modified polyimide resin described by general formula

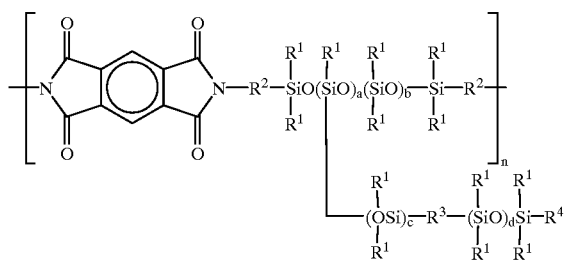

where $R^1$ is an alkyl group or aryl group, $R^2$ is an alkylene group or arylene group, $R^3$ is an alkylene group, $R^4$ is an alkenyl group, a is an integer of at least one, b is an integer of zero or greater, c is an integer of at least one, d is an integer of at least one, and n is an integer of at least one, and (B) a solvent, ii) evaporating a part or all of the solvent, and iii) crosslinking the electrically insulating organic resin by a method selected from the group consisting of heating and irradiation with high-energy rays.

* * * * *